United States Patent [19]
Van der Werf et al.

[11] Patent Number: 5,910,847
[45] Date of Patent: Jun. 8, 1999

[54] METHOD OF DETERMINING THE RADIATION DOSE IN A LITHOGRAPHIC APPARATUS

[75] Inventors: Jan E. Van der Werf; Peter Dirksen; Manfred G. Tenner, all of Eindhoven, Netherlands

[73] Assignee: U.S. Philips Corporation, New York, N.Y.

[21] Appl. No.: 08/800,446

[22] Filed: Feb. 18, 1997

[30] Foreign Application Priority Data

Feb. 15, 1996 [EP] European Pat. Off. ............. 96200378

[51] Int. Cl.$^6$ .............................. G01B 11/00; G03F 9/00
[52] U.S. Cl. .............................................. 356/401; 439/22
[58] Field of Search .................................. 356/399, 401, 356/24, 23; 430/22, 5, 394

[56] References Cited

U.S. PATENT DOCUMENTS 5,674,650   10/1997   Dirksen et al. ........................ 430/22

OTHER PUBLICATIONS

"Latent Image Metrology for Production Wafer Steppers", P. Dirksen et al, SPIE, vol. 2440, pp. 701–711, 1995.

*Primary Examiner*—Frank G. Font
*Assistant Examiner*—Michael P. Stafira
*Attorney, Agent, or Firm*—Daniel E. Tierney

[57] ABSTRACT

A method and apparatus for forming a pattern on a substrate (w), either or not via a mask pattern (c), are described. The radiation dose can be measured accurately and reliably by measuring a latent image of a new, asymmetrical test mark (TM) by means of an optical alignment device present in the apparatus or associated therewith, this latent image being formed by means of production radiation (PB) in the radiation-sensitive layer on the substrate.

14 Claims, 5 Drawing Sheets

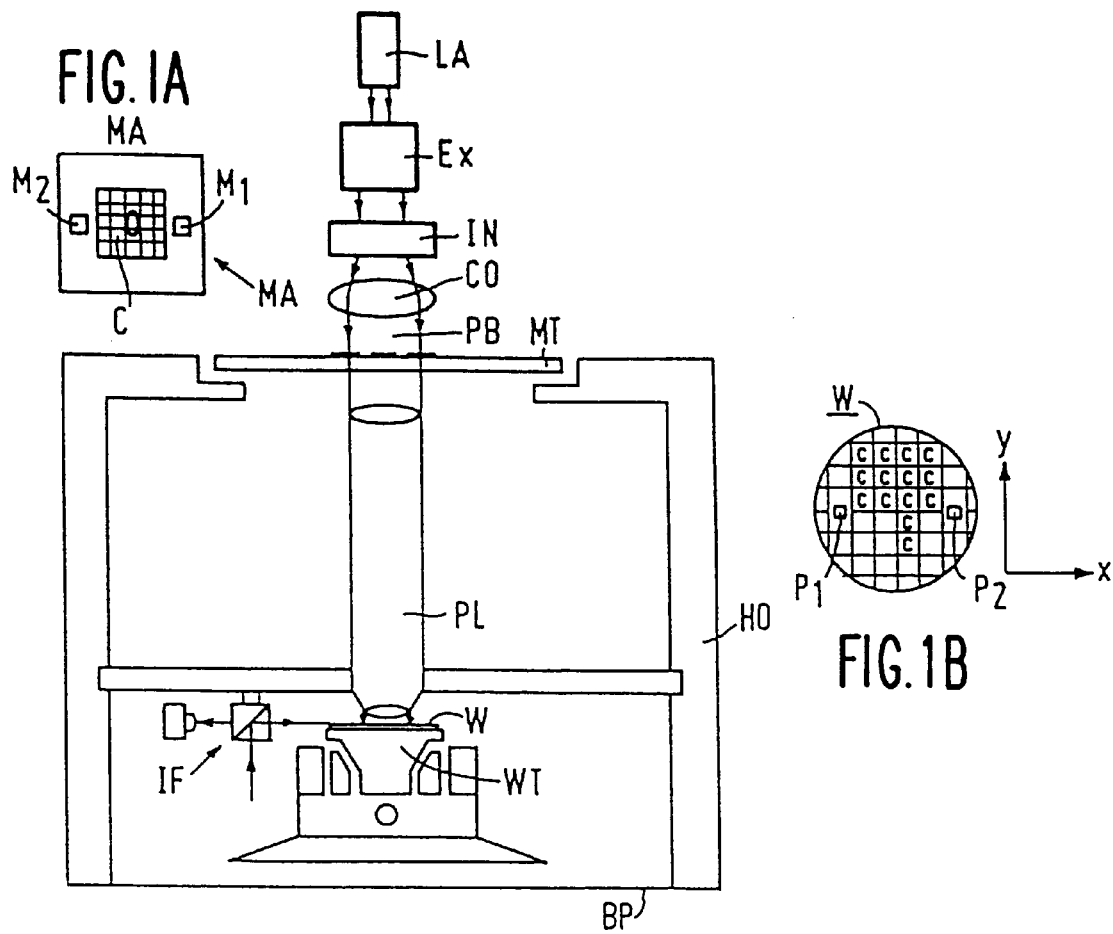
FIG. 1A
FIG. 1B
FIG. 1
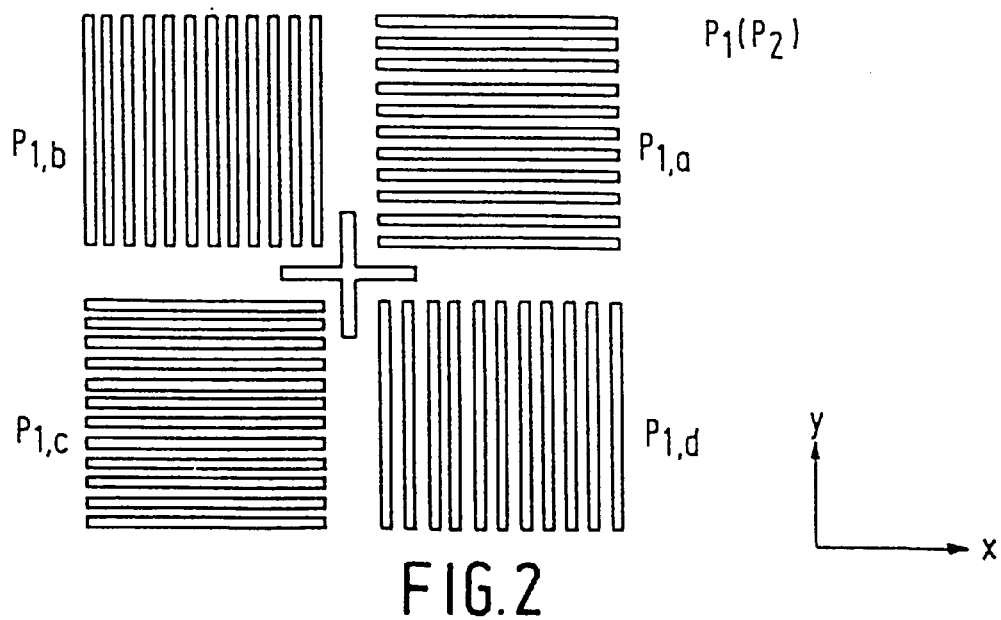
FIG. 2

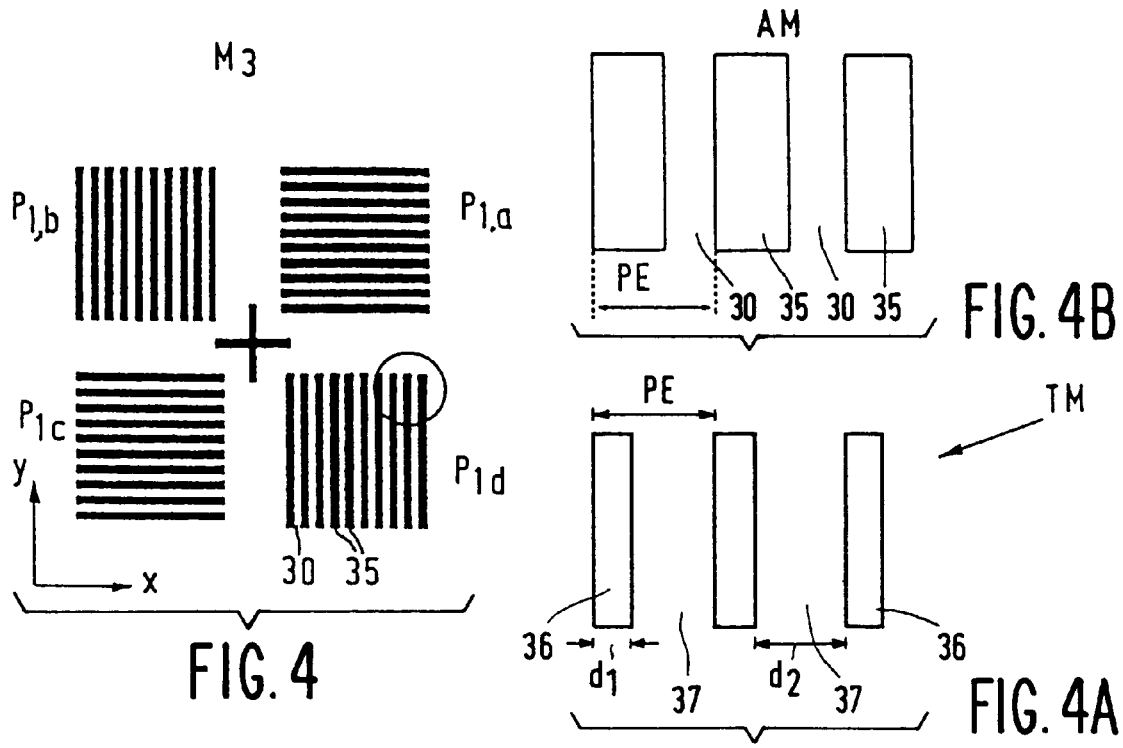
FIG. 4
FIG. 4B
FIG. 4A
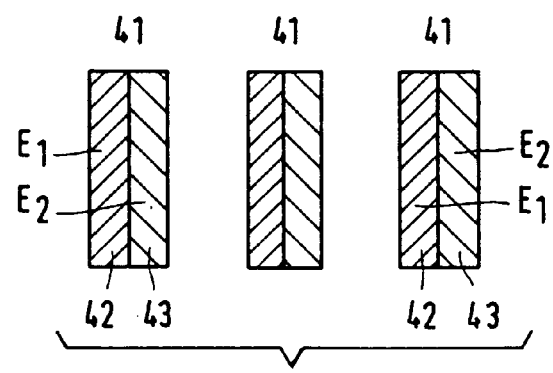
FIG. 5

METHOD OF DETERMINING THE RADIATION DOSE IN A LITHOGRAPHIC APPARATUS

BACKGROUND AND SUMMARY OF THE INVENTION

The invention relates to a method of determining the production radiation dose in an apparatus for producing a pattern on a substrate provided in a substrate table, which method comprises the following steps:

providing a substrate having a radiation-sensitive layer in the substrate table;

providing at least one substrate test mark in the radiation-sensitive layer by means of the production radiation;

detecting a substrate test mark by means of an optical alignment device for aligning a substrate alignment mark with respect to a reference alignment mark;

the substrate test mark having a periodical structure, with a period which is effectively equal to that of the reference alignment mark, and an asymmetrical division of irradiated and non-irradiated strips, the test mark detection consisting of:

first, aligning the substrate test mark relative to the reference alignment mark; and subsequently detecting a substrate test mark asymmetry interpreted by the alignment device as a substrate testmark offset, which asymmetry is dependent on the production radiation dose.

The invention also relates to a test mask which is particularly suitable for use in the method, and to an apparatus for producing a pattern in a substrate, with which the method can be performed.

Producing a pattern is herein understood to mean the provision of such a pattern, such as an IC pattern, in a radiation-sensitive layer. This may be realized by projecting a corresponding mask pattern in the radiation-sensitive layer, using a projection system, in the case of optical lithography, a projection lens system. An image of the mask pattern may also be realized by placing the mask close to the radiation-sensitive layer at a distance of several $\mu$m and by illuminating this mask with production radiation. It is alternatively possible to write the test mark directly in the radiation-sensitive layer by scanning this layer with a narrow beam in conformity with the desired pattern.

The production radiation is the radiation which is used in the apparatus to provide a desired pattern, such as an IC pattern, in a production substrate, after checking measurements and tests, such as the radiation-dose measurement, have been performed. The production radiation may be electromagnetic radiation, such as deep UV radiation, which is used in an optical lithographic apparatus for repetitively imaging an IC mask pattern on a substrate in accordance with the step principle or in accordance with the step-and-scan principle. In the step method, an IC mask pattern is imaged on the substrate in a first IC area. Subsequently the substrate is moved with respect to the mask pattern until a second IC area of the substrate is present under the mask pattern and this pattern is imaged a second time. Then the substrate is moved again, and so forth, until an image of the mask pattern has been formed on all IC areas of the substrate. In the step-and-scan method, the IC pattern is not imaged in one operation but, for example, a narrow projection beam is used which each time images a part of the pattern corresponding to the beam cross-section, while both the mask pattern and the substrate are moved with respect to this beam until this beam has scanned the entire IC pattern and a complete image of the IC pattern has been formed in a first area of the substrate. Subsequently, the substrate is moved until a second IC area is situated under the mask pattern and the process of scanning-imaging is repeated, and so forth.

The production radiation may not only be an optical beam but also a charged-particle beam such as an electron beam or an ion beam with which, while using or not using a suitable projection system, an image of the mask pattern can be formed in a layer sensitive to this radiation, and in which such a beam in this layer causes material changes such as refractive index changes or chemical changes which can be converted into optically detectable changes.

It will be evident from the foregoing that the projection system may be an optical lens system, but also a different system such as an electron lens system which is used in electron beam imaging.

The article "Latent Image Metrology for Production Wafer Steppers" in SPIE, Vol. 2440, page 701, 1995 describes a method comprising the steps of the method described in the opening paragraph for determining the optimum focus setting of the projection lens system in a photolithographic apparatus and for determining various other parameters of the apparatus. In this article it is noted that, in principle, the detection signal obtained may be used to determine the optimum exposure dose, because the detection signal at a fixed focus setting changes with a change of the exposure dose. At the same time, it is also noted that an optimum test mark is being searched for this purpose.

As described in said article, a mask test mark, which is derived from a known mask alignment mark but is now asymmetrical, is imaged in the photosensitive layer of the substrate by means of the elements which are also used in the production process, namely the projection lens system and the production radiation, in the form of a projection beam. Then, a latent, i.e. undeveloped, image of this test mark is detected by means of the optical alignment device which is present in the apparatus.

The advantage of latent-image detection is that the image can be measured in the production apparatus itself and that the substrate with the substrate test mark does not need to be removed from the apparatus so as to be examined by means of, for example a scanning electron microscope. The advantage of the use of said test mark is that the apparatus does not need to be provided with a separate image detection device.

The test mark which is optimal for determining the optimum focus setting has a structure of strips and opaque intermediate strips, which corresponds to that of the alignment mark; however, the transmissive strips of the test mark have been replaced by strips which are partially transmissive and partially consist of a plurality of sub-strips which are alternately transmissive and non-transmissive to the projection beam radiation.

In this method, use is made of the fact that, while the alignment device determines that the center of one of the two symmetrical alignment marks coincides with the center of the image of the second symmetrical alignment mark in a situation where these two symmetrical alignment marks are aligned with each other, this device indicates that the center of an asymmetrical substrate test mark is offset with respect to the center, or point of gravity, of the symmetrical mask alignment mark in the situation where the asymmetrical substrate test mark is aligned with respect to this symmetrical mask alignment mark.

In principle, the above-mentioned asymmetrical test mark may also be used for determining exposure doses. However, it has been found that the exposure dose signal thus obtained is relatively weak and is not optimal for use in the production apparatus. It is an object of the present invention to optimize the radiation dose measurement based on the above-mentioned principle and to provide a suitable test mark. The method according to the invention is characterized in that, per period, a substrate test mark has at least two irradiated strips which are formed by means of the same number of different production radiation sub-doses.

Since within each period of the substrate test mark, two or more irradiated strips, which adjoin or do not adjoin each other and have received different radiation doses, are present in addition to a non-irradiated strip, this test mark is asymmetrical. It is ensured that the test mark effectively has the same period as the reference alignment mark of the alignment device, so that this test mark can be detected by means of this device and its asymmetry can be determined. Effectively the same period for the test mark and the reference mark is understood to mean that the period of the test mark, multiplied by the possible magnification factor with which this mark is imaged on the reference mark, is equal to the period of the reference mark. Use is made of the fact that an order filter is used in the alignment device, which, of the radiation from the test mark, only passes the radiation diffracted in the first orders by the test mark to the detectors. The alignment device supplies sine-shaped signals whose period is determined by that of the reference alignment mark. When observing the test mark, the phase shift of such a sine-shaped signal is measured, which shift is dependent on the asymmetry in the test mark.

As far as the provision of the test mark in the substrate is concerned, there are different embodiments of the method according to the invention. A first embodiment is characterized in that a substrate test mark is provided by directly inscribing this mark into the radiation-sensitive layer by means of narrow-beam charged-particle radiation.

A lithographic apparatus using ion, electron or X-ray radiation as production radiation is to this end provided with an optical alignment device, such as is used by the firm of ASM Lithography in its photolithographic apparatus which is known as wafer stepper. Since very small details can be written with the charged-particle radiation, this radiation is also suitable for directly inscribing the substrate test mark. This radiation causes local material changes in the sensitive layer on the substrate, which changes result in optical changes such as refractive index changes. The pattern of the changes can be observed with the optical alignment device which is provided with a reference alignment mark effectively having the same period as this pattern.

A second embodiment of the method is characterized in that a substrate test mark is provided by imaging a mask in which at least one mask test mark and one mask alignment mark are present, the mask alignment mark constituting the reference alignment mark and the mask test mark consisting of a periodical structure of intermediate strips which are alternately transmissive and non-transmissive to the production radiation and have a period which is equal to that of the mask alignment mark, the strips having a width of at most one fourth of the period, and in that imaging is realized by forming n sub-images of the mask test mark, while the mask and the substrate are movedwith respect to each other in between the successive sub-images in a direction perpendicular to the direction of the strips and along a distance which is at least equal to the width of the irradiated strips in the radiation-sensitive layer, the n sub-images being formed with n different radiation sub-doses and n being an integer of at least two.

Since in each radiation dose measurement the mask test mark with the relatively narrow transmissive strips is imaged n times, a substrate test mark is obtained which has the same period as the mask alignment mark but an exhibits asymmetry in the received radiation distribution and hence an asymmetry in the change of the material. When changing the radiation dose for the total image of the mask test mark, there will be a change of this asymmetry, in other words, the center of gravity of, for example, the refractive index distribution in the substrate test mark is displaced.

This method may be further characterized in that, for imaging the mask test mark, the mask is placed proximate to the substrate and the mask is irradiated with production radiation.

A proximity copy of the mask test mark is then made in the radiation-sensitive layer on the substrate.

This embodiment may be alternatively characterized in that, for imaging the mask test mark, use is made of a projection system which is arranged between the mask and the substrate.

Then, the mask test mark is projected in the radiation-sensitive layer of the substrate. In photolithography, a projection image is preferably used because reduced images of the production mask pattern can then be formed, so that the details in the mask pattern are larger than the corresponding details in the substrate. Such a mask pattern can be realized more easily and at a lower cost than a mask pattern which is suitable for a one-to-one image which is made with a proximity copy. This of course also applies to the mask test mark.

As already noted, when the alignment device detects the substrate test mark, a change of the asymmetry in this mark is interpreted as an offset of this mark relative to a reference. This reference is obtained in that, before detection of the test mark, for example, the substrate and the mask are accurately aligned with respect to each other by means of the global alignment marks which are already present for this purpose in the mask and the substrate and by means of the same alignment device, and in that the test mark is subsequently displaced towards the alignment beam while carrying out an accurate displacement measurement and check by means of a multi-axis interferometer system which is also already present in an optical lithographic apparatus for determining the movements of the substrate table relative to the mask table. By comparing the detected position of the test mark image with said reference, the apparent displacement of the test mark image acquires the effect of a zero offset of the alignment signal. This zero offset is dependent on the production radiation dose.

The novel method is not only suitable for latent images but may also be used to great advantage for developed images which have been converted into phase structures in the developing process. The detection of developed images is particularly important when using photosensitive layers which are specially suitable for radiation at a wavelength in the deep ultraviolet range, with which IC mask images having very small line widths of the order of 0.25 micron can be realized.

The term latent image comprises both the pattern of material changes obtained only by radiation, such as refractive index changes, and such a pattern which has been heated after irradiation, so that stronger material changes are produced via chemical reactions, resulting in stronger optical effects. The heated latent image is referred to as Post-Exposure Baking (PEE) image.

A preferred embodiment of the method, in which a substrate test mark is obtained by projection of a mask test mark, is characterized in that n is equal to two and that between the formations of the sub-images the mask and the substrate are moved with respect to each other along a distance which is equal to one fourth of the period of the substrate test mark.

A substrate test mark is then obtained whose irradiated strips are as wide as the non-irradiated strips, so that this mark has the same geometry as the alignment mark but an asymmetry in the received radiation distribution.

The number of images is then minimal, as well as the time required for a radiation dose measurement, while the measurement is still sufficiently accurate. n may alternatively be 3, 4, 5, etc. With an increasing n, a finer tuning of the radiation distribution is possible and a more accurate measurement can be obtained, but the time required for a radiation dose measurement also increases.

To be able to determine the correct radiation dose by way of comparison, the method according to the invention is further characterized in that the same test mark is provided m times at different positions on the substrate, while m different radiation doses each having n radiation sub-doses are used for forming the m test marks, and in that the correct radiation dose is determined by comparing the asymmetry in the m substrate test marks.

This method may be further characterized in that the ratio between the received radiation sub-doses is constant for the m substrate test marks.

All n radiation sub-doses then vary in conformity with a variation in the radiation doses of the m images.

Alternatively, this method may also be characterized in that one of the radiation sub-doses for the m substrate test marks varies, whereas the other radiation sub-doses are constant.

There are different embodiments of the method according to the invention, also as far as the test mark detection is concerned. A first embodiment of the method is further characterized in that, after the provision of the test mark in the radiation-sensitive layer, the latent image formed in this layer is detected by means of the alignment device.

This provides the possibility of a rapid measurement of the radiation dose.

A second embodiment of the method is further characterized in that, after the provision of the test mark in the radiation-sensitive layer, the substrate is removed from the substrate table, subsequently developed and then placed on a substrate table again, whereafter the developed substrate test mark is detected by means of the alignment device.

Detector signals having a large amplitude can be obtained in this way.

Both embodiments have the advantage that the substrate test marks are measured in the same or similar apparatus as the apparatus with which the test marks have been formed, and that the measurement can be carried out more rapidly than in the case where an optical or electron microscope would be used. It is alternatively possible to provide the substrate test marks in a first apparatus and to detect them in a second apparatus of the same type.

An embodiment of the method, with which a better reference for the test mark signal is obtained, is further characterized in that the radiation-sensitive layer is provided with a double mark consisting of said test mark and an associated alignment mark having a periodical structure of irradiated strips alternating with non-irradiated strips of the same width and a period which is equal to that of the test mark.

Since the alignment mark from which the reference is derived is located proximate to the test mark, the reference will be considerably more reliable than if it is derived from an alignment mark which is present at a larger distance from the test mark.

If the substrate test marks obtained by projection of a mask test mark are only to be used for a limited number of measurements, the method according to the invention may be further characterized in that use is made of a production mask which is provided with at least one test mark.

For obtaining a large degree of freedom in the choice of the positions of the test-mark images on the substrate, and hence in measuring possibilities, the method according to the invention is further characterized in that use is made of a test mask which is provided with at least one test mark.

The invention also relates to a novel test mask intended for use in the method described hereinbefore. This test mask, which is provided with at least one test mark and at least one alignment mark, in which the alignment mark and the test mark have a periodical structure of strips which are transmissive to the production beam radiation and alternate with opaque intermediate strips, with the periods of both structures being equal, is characterized in that the transmissive strips of the test mark have a width of at most one fourth of a period.

Said alignment mark may be formed by a global alignment mark which is also present in a production mask outside the IC pattern to be projected for aligning the mask with respect to the substrate. By making use of this alignment mark and the very accurate interferometer system for displacing the substrate table in a defined manner, the test mark in the aligned state can be introduced into the measuring beam of the alignment device.

A more accurate alignment and a more rapid detection of the test mark may, however, be realised if the test mask is further characterized in that a separate alignment mark of said type is provided proximate to a test mark.

Proximate is herein understood to mean that the distance between the alignment mark and the test mark at the level of the substrate is smaller than the dimension of an IC area, or in the case of projection lithography, is equal to a fraction of the dimension of the image field of the projection lens. If the projection lens exhibits distortion, then it is substantially the same for the images of both marks.

The test mark may be further characterized in that it comprises not only a test mark in the center but also in at least the four corners.

This provides the possibility of measuring the uniformity of the radiation throughout an IC area on a substrate and, in the case of projection lithography, the uniformity within the image field of the projection lens.

A further embodiment of the test mask is characterized in that each test mark comprises a plurality of portions, in which the direction of the grating strips of one portion is perpendicular to the direction of the grating strips of another portion.

With such a test mask, it is possible to measure in two mutually perpendicular directions.

In accordance with a further aspect, the test mask is further characterized in that the test mark has such a size that its image formed with the production radiation fits in an intermediate area on the substrate which is located between two areas in which the production mask pattern must be imaged.

A test mask which is particularly suitable for a short-lasting radiation dose measurement is further characterized in that the width of the strips for the test mark is equal to one fourth of the structure period.

The invention also relates to an apparatus for performing the method according to the invention, which apparatus successively comprises a radiation source unit for supplying a production radiation, and a substrate table, and further comprises an optical alignment device for aligning a substrate mark with respect to a reference alignment mark and a radiation dose measuring device. This apparatus is characterized in that the radiation dose measuring device is constituted by the alignment device and in that the radiation dose measuring device is adapted to detect, during each radiation dose measurement, the image of both a substrate test mark and of a substrate alignment mark and is provided with means for determining the difference between the observed aligned positions of the two mark images.

This apparatus may be further characterized in that it is further provided with a mask table for accommodating a test mask, and with a projection system arranged between the mask table and the substrate table.

These and other aspects of the invention will be apparent from and elucidated with reference to the embodiments described hereinafter.

BRIEF DESCRIPTION OF THE DRAWINGS

In the drawings:

FIG. 1 shows diagrammatically an embodiment of an optical apparatus for repetitively imaging a mask pattern on a substrate;

FIG. 2 shows an embodiment of a known alignment mark for use in such an apparatus;

FIG. 4 shows an embodiment of an asymmetrical test mark according to the invention;

FIG. 5 shows an image of this test mark formed in a substrate;

DETAILED DESCRIPTION

Figure 3:
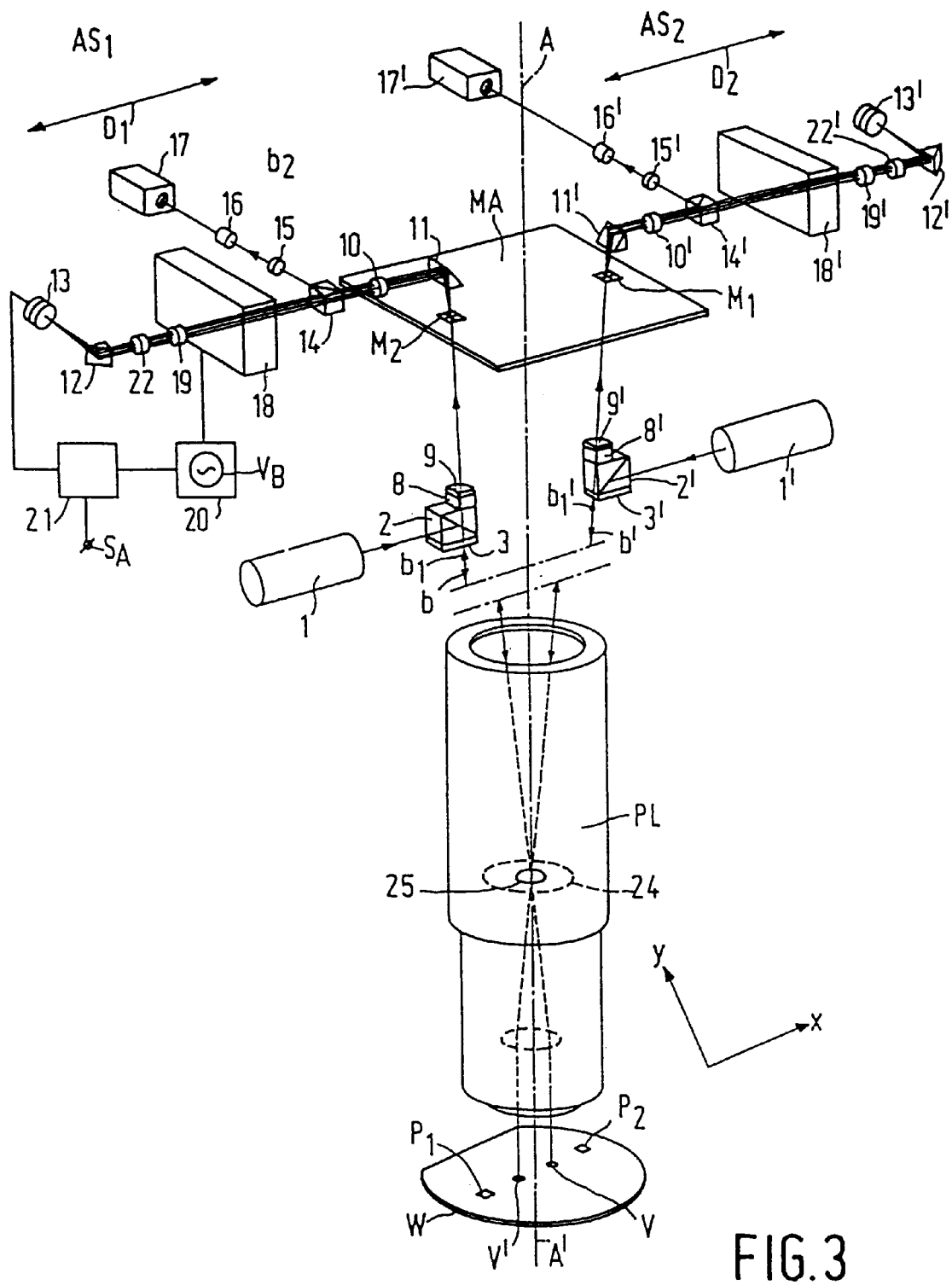
FIG. 3 shows a known embodiment of an alignment device for such an apparatus.

FIG. 1 shows diagrammatically a known embodiment of an apparatus for repetitively imaging a mask pattern on a substrate in accordance with the step principle. The main components of this apparatus are a projection column in which a mask pattern C to be imaged is provided and a movable substrate table WT with which the substrate can be positioned with respect to the mask pattern C.

The projection column accommodates an illumination system which comprises, for example a laser LA, a beam widener $E_x$, an element IN also referred to as integrator realising a homogeneous distribution of radiation within the projection beam PB, and a condensor lens CO. The projection beam PB illuminates the mask pattern C present in the mask MA, which mask is arranged on a mask table MT.

The beam PB passing through the mask pattern C traverses a projection lens system PL which is arranged in the projection column and is only shown diagrammatically, which projection lens system forms images of the pattern C on the substrate W. The projection lens system has, for example a magnification M=⅕, or M=¼, a numerical aperture NA=0.6 and a diffraction-limited image field having a diameter of 22 mm.

The substrate W is arranged on a substrate table WT supported, for example by air bearings. The projection lens system PL and the substrate table WT are arranged in a housing HO whose lower side is closed by a base plate BP of, for example granite and whose upper side is closed by the mask table MT.

As is shown in FIG. 1, the mask MA comprises, for example two alignment marks $M_1$ and $M_2$. These marks preferably consist of diffraction gratings but may alternatively be constituted by other marks having a symmetrical structure. The alignment marks are preferably two-dimensional, i.e. their grating strips extend in two mutually perpendicular directions, the X and Y directions in FIG. 1. The substrate W, for example a semiconductor substrate on which the pattern C must be imaged a number of times next to each other, comprises a plurality of alignment marks, preferably again two-dimensional diffraction gratings, two of which, $P_1$ and $P_2$, are shown in FIG. 1. The marks $P_1$ and $P_2$ are located outside the areas of the production substrate W on which the images of the pattern C must be formed. The grating marks $P_1$ and $P_2$ are preferably constituted as phase gratings and the grating marks $M_1$ and $M_2$ are preferably constituted as amplitude gratings.

FIG. 2 shows an embodiment of one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two others, $P_{1,a}$ and $P_{1,c}$, are used for alignment in the Y direction. The two sub-gratings $P_{1,b}$ and $P_{1,c}$ have a grating period of, for example 16 $\mu$m and the sub-gratings $P_{1,a}$ and $P_{1,d}$ have a grating period of, for example 17.6 $\mu$m. Each sub-grating may have a dimension of, for example 200×200 $\mu$m. With this grating and a suitable optical system an alignment accuracy which, in principle, is smaller than 0.1 $\mu$m can be achieved. Different grating periods have been chosen so as to increase the capturing range of the alignment device.

FIG. 3 shows the optical elements of the apparatus used for aligning a production mask with respect to a production substrate. The apparatus comprises a double alignment detection system consisting of two separate and identical alignment systems $AS_1$ and $AS_2$ which are positioned symmetrically with respect to the optical axis AA' of the projection lens system PL. The alignment system $AS_1$ is associated with the mask alignment mark $M_2$, and the alignment system $AS_2$ is associated with the mask alignment mark $M_1$. The corresponding elements of the two alignment systems are denoted by the same reference numerals, while those of the system $AS_2$ are distinguished from those of the system $AS_1$ by means of the primed notation.

The structure of the system $AS_1$ will now be described, as well as the way in which the mutual position of the mask mark $M_2$ and, for example the substrate mark $P_1$ is determined by means of this system.

The alignment system $AS_1$ comprises a radiation source 1, for example a helium-neon laser which emits an alignment beam b. This beam is reflected towards the substrate W by a beam splitter 2. The beam splitter may consist of a semitransmissive mirror or a semitransmissive prism but is preferably constituted by a polarization-sensitive dividing prism which is followed by a $\lambda/4$ plate 3 in which $\lambda$ is the wavelength of the beam b. The projection lens system PL focuses the beam b in a small radiation spot V having a diameter of the order of 1 mm on the substrate W. This substrate reflects a part of the beam as beam $B_1$ towards the mask MA. The beam $b_1$ traverses the projection lens system PL, which system images the radiation spot V on the mask. Before the substrate is arranged in the illumination apparatus, it has been prealigned in a prealignment station coupled to the apparatus, for example the station described in European Patent Application 0.164.165, such that the radiation spot V is located on the substrate mark $P_2$. This mark is then imaged by the beam $b_1$ on the mask mark $M_2$. Taking the magnification M of the projection lens system into account, the dimension of the mask mark $M_2$ is adapted to that of the substrate mark $P_2$ SO that the image of the mark $P_2$ accurately coincides with the mark $M_2$ when the two marks are mutually positioned correctly.

On its path to and from the substrate W, the beam b and $b_1$ has traversed the $\lambda/4$ plate 3 twice, whose optical axis is at an angle of 45° to the direction of polarization of the linearly polarized beam b emitted by the source 1. The beam $b_1$ passing through the $\lambda/4$ plate then has a direction of polarization which is rotated 90° with respect to the beam b so that the beam $b_1$ is passed by the polarization dividing prism 2. The use of the polarization dividing prism in combination with the $\lambda/4$ plate provides the advantage of a minimal radiation loss when coupling the alignment beam into the radiation path of the alignment system.

The beam $b_1$ passed by the alignment mark $M_2$ is reflected by a prism 11 and directed towards a radiation-sensitive detector 13, for example by a further reflecting prism 12. This detector is, for example a composite photodiode having, for example four separate radiation-sensitive areas in conformity with the number of sub-gratings in accordance with FIG. 2. The output signals of these detectors are a measure of the coincidence of the mark $M_2$ with the image of the substrate mark $P_2$. These signals may be processed electronically and used for moving the mask with respect to the substrate by means of driving systems (not shown), such that the image of the mark $P_2$ coincides with the mark $M_2$. An automatic alignment apparatus is thus obtained.

A beam splitter 14 in the form of, for example a partially transmissive prism may be arranged between the prism 11 and the detector 13, which prism splits a portion of the beam $b_1$ as beam $b_2$. The split beam $b_2$ is then incident via, for example two lenses 15 and 16 on a television camera 17 which is coupled to a monitor (not shown) on which the alignment marks $P_2$ and $M_2$ are visible to a user of the projection apparatus. This user may then ascertain whether the two marks coincide and may displace the substrate W by means of manipulators so as to cause the marks to coincide.

Analogously as described above for the marks $M_2$ and $P_2$, the marks $M_1$ and $P_2$, and the marks $M_1$ and $P_1$ may also be aligned with respect to each other. The alignment system $AS_2$ is used for the two last-mentioned alignments.

For particulars about the alignment procedure by means of the alignment systems, reference is made to U.S. Pat. No. 4,778,275. As also described in this Patent, the alignment systems $AS_1$ and $AS_2$ cooperate very closely with an extremely accurate two-dimensional displacement measuring system for measuring the displacement of the substrate with respect to the mask during the alignment procedure. Then the positions of, and the mutual distances between, the alignment marks $P_1$ and $P_2$, $M_1$ and $M_2$ can be fixed in a system of coordinates determined by the displacement measuring system. The displacement measuring system denoted by IF in FIG. 1 is, for example an interferometer system described in U.S. Pat. No. 4,251,160.

Since the projection lens system PL is designed for the wavelength of the projection beam PB, which should be as small as possible in view of the desired large resolving power, and may thus differ considerably from that of the alignment beam, deviations may occur when using this system PL for imaging the alignment marks $P_1$, $P_2$ and $M_1$, $M_2$ on to each other. Then, the substrate alignment marks $P_1$, $P_2$ may not be imaged in the plane of the mask pattern in which the mask alignment marks are located but at a given distance therefrom, which distance depends on the difference between the wavelengths of the projection beam and the alignment beam and the difference between the refractive indices of the material of the projection lens elements for the two wavelengths. If the projection beam has a wavelength of, for example 248 nm and the alignment beam has a wavelength of 633 nm, this distance may be as much as 2 m. Moreover, due to said wavelength difference, a substrate alignment mark is imaged on a mask alignment mark with a magnification which deviates from the desired magnification, which deviation increases with an increasing wavelength difference.

To correct for said deviations, an extra lens, or correction lens 25 may be arranged in the projection column PL. In contrast to what is shown in FIG. 3, the alignment beam is then not coupled into the apparatus above the projection lens but through a window in the lens holder and with a reflecting element such as a wedge under and proximate to the correction lens. The correction lens is arranged at such a height in the projection column that, on the one hand, the sub-beams of the different diffraction orders of the alignment beam in the plane of the correction lens, which sub-beams are formed by a substrate alignment ark, are sufficiently separated so as to be able to influence these sub-beams separately, and on the other hand, this correction lens has a negligible influence on the projection beam and the mask image formed therewith. The projection lens is preferably located in the rear focal plane of the projection lens system. If this system is telecentric at the substrate side, this focal plane coincides with the plane of the exit pupil of this system. If, as is shown in FIG. 3, the correction lens 25 is in a plane 24 where the chief rays of the alignment beams b and b' intersect each other, this lens can be simultaneously used for correcting the two alignment beams.

The correction lens has such a power that it changes the direction of the sub-beams diffracted in the first order by a grating in such a way that the chief rays of these beams intersect each other in the plane of the mask alignment mark $M_2$. Moreover, the correction lens has such a small diameter that the higher-order sub-beams which are deflected through larger angles by the mark $P_2$ than the first-order sub-beams do not pass through this lens. The correction lens further comprises an element preventing the zero-order sub-beams b(0), b'(0) from passing through the correction lens. This element may be constituted by said wedge which is used for coupling the alignment beam into the projection lens system. It is achieved by said measures that only the first-order sub-beams are used for imaging the grating $P_2$ on the grating $M_2$, so that some additional advantages are obtained.

By suppressing the zero-order sub-beam, the contrast in the image of $P_2$ can be increased considerably. This renders the alignment device particularly suitable for the latent-image detection to be described hereinafter, because latent images of themselves have a relatively low contrast. Since the second and higher-order sub-beams are suppressed, irregularities in the grating $P_2$ do not have any influence on the alignment signal. When only the first-order sub-beams are used, the second harmonic of the grating $P_2$ is imaged, as it were. In other words, apart from the magnification M of the projection lens system PL, the image of $P_2$ has a period which is half that of the grating $P_2$. If it is ensured that the grating period of the grating $M_2$ is equal to that of the image of $P_2$, i.e. equal to M/2 times the grating period of the grating $P_2$, the accuracy with which the gratings $M_2$ and $P_2$ are aligned is twice as large as in the situation where the full beam b is used for forming the image.

After the description of the system $AS_1$, which is used for aligning the mask alignment mark $M_2$ with respect to a substrate alignment mark, the system $AS_2$ with which the mask alignment mark $M_1$ is aligned with respect to a substrate alignment mark does not need any further explanation. The system $AS_2$ comprises similar elements and operates in the same way as the system $AS_1$. As already shown in FIG. 3, the systems $AS_1$ and $AS_2$ have the correction lens 25 in common. Instead of a double alignment device, the projection apparatus may alternatively comprise a single alignment device as described, for example in U.S. Pat. No. 4,251,160.

The projection apparatus is further provided with a focus servo device comprising a focus error detection device for detecting, during repetitive imaging of a production mask on a production substrate, a deviation between the image plane of the projection lens system and the plane of the production substrate. When such a deviation occurs, the focusing can be corrected by means of the signal supplied by the focus error detection device, for example by displacing the projection lens along its optical axis.

For very accurately determining the X and Y positions of the substrate table, the projection apparatus is provided with a composite interferometer system consisting of, for example two units. The unit $IF_1$ emits one or more beams into the Y direction towards a reflecting side face of the substrate table and also receives the reflected beams. The X position of the table can be determined thereby. Analogously, the Y position of the substrate table can be detected by means of the second interferometer unit. The interferometer system may be implemented as described in U.S. Pat. No. 4,251,160 and then works with two beams. Instead of this two-axis interferometer system, a three-axis system as described in U.S. Pat. No. 4,737,823 or a multi-axis system as described in European Patent Application 0 498 499 may alternatively be used.

By using the substrate table position detection device, or interferometer system, the positions of, and the mutual distances between, the alignment marks $P_1$ and $P_2$ and $M_1$ and $M_2$ can be fixed during alignment in a system of coordinates defined by the interferometer system. Then it is not necessary to refer to the frame of the projection apparatus or to a part of this frame so that variations in this frame due to, for example temperature variations, mechanical creep and the like do not have any influence on the measurements.

At a given thickness of the photosensitive layer, the contrast of the image of an IC mask pattern formed in the photosensitive layer is dependent on the quantity of radiation energy which is absorbed by the layer and is used for activating this layer. The quantity of energy which is sent to the layer is dependent on the radiation power of the source LA (FIG. 1) and on the time interval during which a shutter present in the projection apparatus is open. The quantity of this energy which is absorbed by the photosensitive layer depends on the composition of the layer which generally consists of a number of sub-layers, in which relevant parameters are, for example, the layer thickness and the reflection coefficient of the photosensitive layer. As this reflection coefficient is larger, there is less energy suitable for activating the photoactive component in this layer. The optical thickness of this layer, i.e. the product of its geometrical thickness and its refractive index also determine the reflection coefficient. To be able to produce satisfactory images of the mask pattern by means of the projection apparatus, it is therefore necessary to satisfactorily set and periodically measure the exposure dose and hence the quantity of energy absorbed by the photosensitive layer.

To perform this measurement, a mask having at least one test mark is provided in the projection apparatus, and this test mark is imaged in the photosensitive layer of a substrate. This mask may be a special test mask. However, the test mark may also be provided in a production mask outside the IC mask pattern C.

According to the invention, the test mark M3 has an asymmetrical pattern, an embodiment of which is shown in FIG. 4. This pattern TM differs from that of the alignment mark, denoted by AM in the top right part of FIG. 4, in that the transmissive strips 36 have a width $d_1$ which is smaller than the width $d_2$ of the intermediate strips. In the embodiment of FIG. 4, the width $d_1$ is equal to one fourth of the period PE of the test mark. This pattern is imaged on the substrate a number of times determined by the ratio between the width $d_1$ and the period PE, the mask and the substrate between the forming the successive images being moved relative to each other in the width direction of the strips along a distance which is equal to, for example, the width $d_1$, and different sub-exposure doses being used for forming the successive images. In the embodiment of FIG. 4, two images are formed with two different sub-exposure doses E1 and E2. Consequently, the total image 40 of the test mark formed in the photosensitive layer and shown in FIG. 5 has the same geometry as the alignment mark, but the strips 41 in the image, which strips correspond to the strips 35 of the alignment mark, consist of two sub-strips 42 and 43 which have received different sub-exposure doses E1 and E2. The image 40 thus exhibits an asymmetry with respect to the alignment mark.

If E1 is larger than E2, the material of the strip 42 will be more activated at low doses of E1 and E2 than that of the strip 43, so that the center of gravity of the material change, such as a refractive index change, is located in the strip 42. When the exposure doses are increased, while maintaining the condition that E1/E2 is constant, the material of strip 42 will be saturated and that of the strip 43 will not yet be saturated. With a further increase of the exposure doses, also the material of the strip 43 will be saturated and the center of gravity will be displaced to the center between the strips 42 and 43. The quantity of the exposure dose is thus converted into a position of the center of gravity of the refractive index distribution within the image of the test mark in the photosensitive layer and thus in an apparent displacement of this image, which displacement can be observed with the alignment device.

The width of the radiation-transmissive strips 36 of the test mark may alternatively be one sixth, one eighth, etc. part of the period PE instead of one fourth. Then, three, four, etc. images, respectively, of this test mark must be made, with the displacements between the sub-images being, for example, always equal to the width of the strips 36. With an increasing number of sub-images, a finer sub-distribution may be made, on the one hand, in the total image, so that the measurements can be performed with greater sensitivity, but, on the other hand, the quantity of time required for producing the total image increases.

The displacements between the forming of the sub-images do not need to be equal to the width of the strips 36, but may also be larger. Then, an image pattern is obtained in which unilluminated strips are located between the illuminated strips 36. When imaging by means of more than two sub-exposures, the successive sub-exposure doses have an increasing or decreasing intensity, but a different intensity distribution is alternatively possible. There is a great freedom of choosing the intensity distribution of the sub-exposures, the number of sub-exposures and the positioning of the illuminated strips 36. It is only important that the period of the total image formed is equal to the period of the alignment mark.

For realizing the very accurate displacements of the mask with respect to the substrate between the successive sub-exposures for obtaining the total image of the test mark, the very accurate interferometer system which is already present in the apparatus is used to great advantage.

All strips 36 of the test mark have of course the same, reduced width. In principle, it is necessary to measure in only one direction for determining the exposure dose, while the test mark may consist of a linear grating such as the grating portion $P_{1,d}$ of FIG. 4. If the test mark comprises two linear gratings, such as the grating portions $P_{1,a}$ and $P_{1,d}$ of FIG. 4, for measuring in two mutually perpendicular directions, the strips of the two grating portions have the same, reduced width. When a test mark consisting of four grating portions $P_{1,a}$, $P_{1,b}$, $P_{1,c}$ and $1_{1,d}$ is used, all strips of all grating portions have the same, reduced width.

When a test mark having a two-dimensional structure is used, the displacements between the forming of the sub-images may vary in the diagonal direction with respect to the test mark pattern.

The first function of the alignment device is to fix the position of a substrate alignment mark with respect to a mask alignment mark. If these alignment marks have the same periodical structure, taking the magnification of the projection lens system and the possible presence of a first-order diaphragm into account, and if they are satisfactorily aligned with respect to each other, the signal supplied by the alignment detector, 13, 13' in FIG. 3, is, for example minimal. If a substrate mark, such as the latent image of the test mark of FIG. 4, has an asymmetrical structure, then this no longer fits with the mask mark, so that the alignment signal is no longer minimal, even if this substrate mark is correctly aligned with respect to the mask mark. The asymmetry in the latent image is interpreted by the alignment device as an offset of this image with respect to its reference, hence an alignment mark. Due to the asymmetry, the alignment signal, or latent-image detection signal, undergoes a zero offset, generally referred to as offset.

It has been found that the extent of asymmetry, and hence the offset of the alignment signal, is dependent on the exposure dose. At a low dose, this offset is large, and at a high dose, this offset is low, as is apparent from FIG. 6. In this Figure, the value of the offset OA (in nm) is given as a function of the exposure dose E1 (in mJ/cm) for a given projection apparatus and a given substrate.

Figure 6:
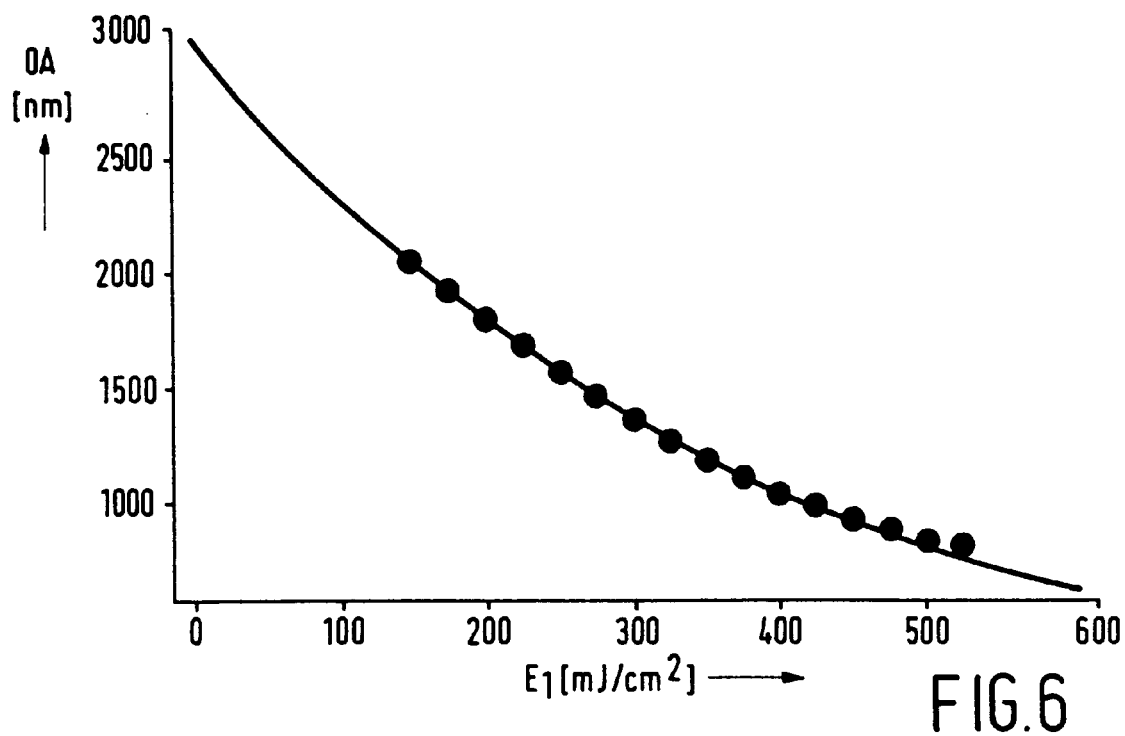
FIG. 6 shows the variation of a latent-image detection signal as a function of the exposure doses use.

The curve of FIG. 6 applies to a test mark in which the width of the transmissive strips is ¼ of the period and which is imaged in two exposure steps with exposure doses E1 and E2, in which the ratio E1/E2 is constant. For each of the values given for E1, E2 has such a value that the latter condition is satisfied.

However, it is alternatively possible that E1 only is varied and E2 is maintained constant.

When using more than two sub-images, the ratio between the sub-exposure doses may be maintained constant, or the dose of one sub-exposure may be maintained constant and those of the other sub-exposures may be varied in conformity with the variation of the total exposure dose.

In the manufacture of ICs having a very large number of components, the projection beam should have a very short wavelength, for example of the order of 240 nm. Radiation having such a wavelength is referred to as deep UV radiation. Special photoresists, known as deep UV resists, have been developed for this radiation, and they have a different composition than the more conventional photoresists which are used for projection beam radiation of longer wavelengths, for example 365 nm. To obtain a satisfactory latent image in a deep UV resist, such a photoresist is preferably heated after it has been illuminated, so that the desired refractive index differences, hence optical path length differences are produced to a stronger extent in the photoresist. This process is known as "Post-Exposure Baking" (PEB) and the image obtained, which is still the latent image, is known as the PEB image. It will be evident that the method according to the invention can also be used for such a PEB image.

The invention may also be used for developed test-mark images which are obtained by removing the substrate from the projection apparatus after it has been illuminated, developing it so that the illumination index variations are converted into a height profile, hence phase structure, and subsequently placing it in the apparatus again, whereafter the test-mark image can be detected and examined. The advantage is then maintained that a test-mark image is measured in the same apparatus as the one in which this image has been formed. This is a more rapid process than the conventional measuring process by means of, for example an optical microscope or an electron microscope. When developed test-mark images are measured, detector signals are obtained which have larger amplitudes than the signals obtained when latent test-mark images are measured. Measuring developed test-mark images is particularly important when deep UV resists are used.

Before the asymmetry in the test-mark image can be detected, this image must first be correctly positioned in the alignment device, hence it must be aligned. If the position of the test mark in the mask is known, the global alignment marks $M_1$, $M_2$ and $P_1$, $P_2$ in the mask and the substrate, respectively, can be used for this alignment. After the mask and the substrate have been aligned with respect to each other by means of these marks and in the way as described with reference to FIG. 3, the test mark is imaged in the photoresist. Subsequently the substrate table is moved under the control of the very accurate interferometer system in such a way that the formed test-mark image, latent or developed, in the aligned state is positioned under a global alignment mark of the mask.

However, for aligning a, for example latent, image of a test mark, use is preferably made of an extra alignment mark associated with the test mark, which extra mark is located close to the test mark in a test mask. This alignment mark is imaged simultaneously with the test mark so that not only a latent image of the test mark but also a latent image of the alignment mark, or a latent alignment mark is formed in the photoresist. After the latent alignment mark has been aligned with respect to the associated extra alignment mark in the mask, the substrate table only needs to be moved over a small distance of the order of 1 mm so as to position the latent image of the test mark correctly with respect to said extra alignment mark. This procedure may, of course, also be performed with developed, or PEB test-mark and alignment-mark images.

Figure 7:
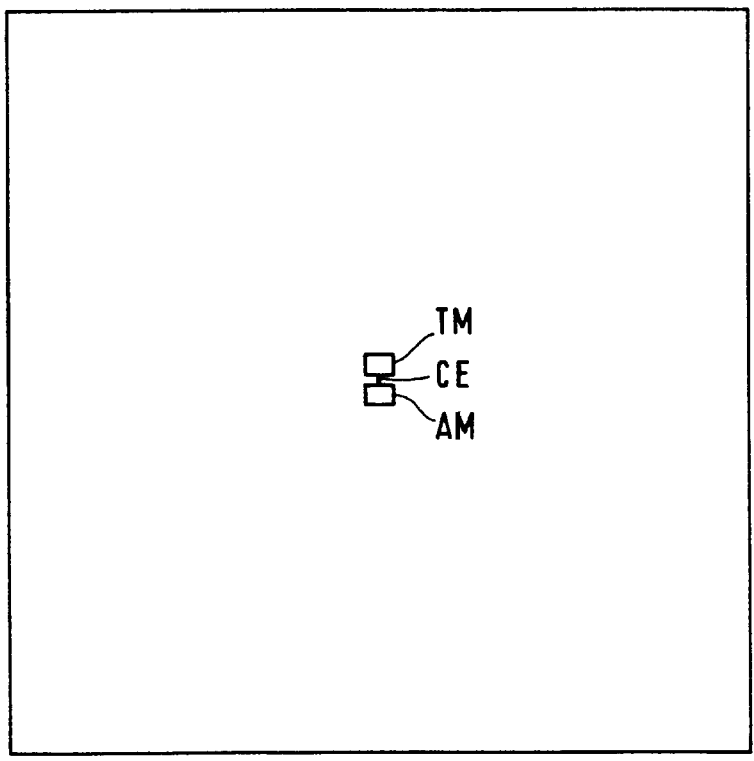
FIG. 7 shows an embodiment of a test mask.

FIG. 7 shows a test mask TMA provided with an extra alignment mark AM in the close proximity of a test mark TM. These marks are provided, for example in the centre CE of the mask.

The fact that for each exposure dose a given value of the latent-image detection signal AOS, hence a given value of the offset AO of the alignment signal is associated with each exposure dose can be used for regularly measuring and, if necessary, correcting the exposure dose during a production projection process. To this end, an optimum exposure dose obtained in the conventional manner by making test images of a mask pattern with different exposure doses in a photoresist, developing this resist and observing the images by means of a SEM is used as a basis. It can then be ascertained which offset AO of the alignment signal is associated therewith. During the production projection process it can be checked at regular instants whether this offset is indeed achieved. If this is not the case, the exposure dose may be adapted in known manner.

To have a more reliable measurement of the exposure dose, particularly when the latent-image detection signals are small, a table of different exposure doses and associated line widths in the images can be made and stored in the signal processing unit of the projection apparatus from the data obtained in the conventional test image measurement by means of the SEM. If such a table is available, an exposure dose may be allocated to an offset value obtained from a latent-image detection and the deviation with respect to the desired exposure dose can then be determined.

One of the advantages of the latent-image detection is that the images are measured in the apparatus with which these images have been formed. This advantage is maintained if the substrate plus the photoresist is developed after images of the test mark have been formed therein and is placed in the projection apparatus again for measuring the then developed images by means of the alignment device. On the one hand, this process is more rapid than the conventional measuring process and, on the other hand, supplies detector signals having larger amplitudes than the signals from pure latent images.

It is also possible to form a test mark image by means of a first apparatus and to detect the latent, or developed image by means of a second, similar, apparatus.

Figure 8A:
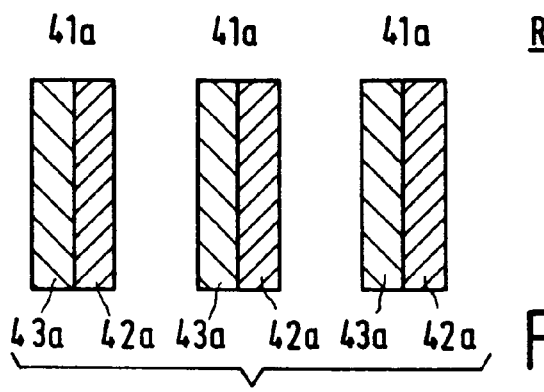
FIG. 8 shows a test mark and an associated reference mark having an opposed asymmetry.
Figure 8:
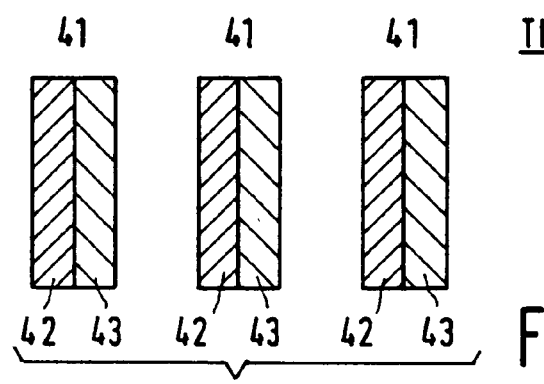

The reference mark for a test mark may not only be a symmetrical extra alignment mark as described hereinbefore, but also an asymmetrical mark whose asymmetry is opposed to that of the test mark. FIG. 8 shows diagrammatically such a reference mark RM and the associated test mark TM formed on the substrate. If the illuminated strips 41, 41a consist of two substrips 42a, 43a and 42, 43, respectively, as is shown by way of the herringbone-shaded areas, the strip structure of the reference mark with respect to the Y axis is mirrored to that of the test mark. In the image detection, each of these marks is first aligned with respect to a symmetrical alignment mark, for example a global alignment mark, and subsequently the offset in the alignment signal is determined for each mark. By subtracting the detector signals of the two asymmetrical marks, a signal is obtained whose variation due to the asymmetry in the test mark is, in principle, twice as large than when only the test mark is asymmetrical. Also if the test mark has more than two illuminated sub-strips per period, an asymmetrical reference mark may be used.

Figure 9:
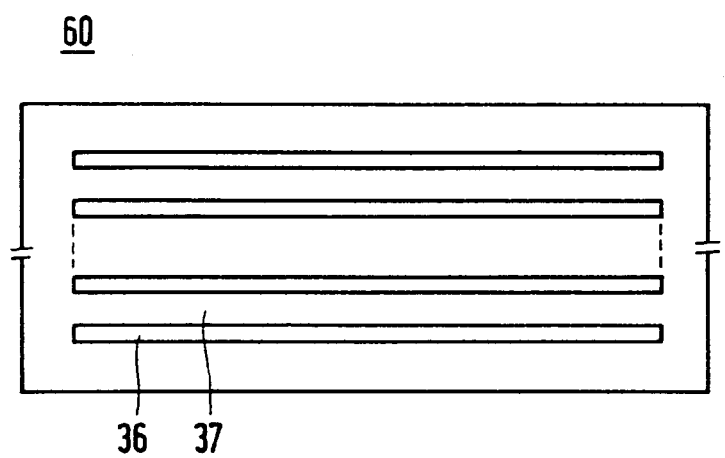
FIG. 9 shows a test mark which is suitable to be provided in the scribe line of an IC.

FIG. 9 shows an embodiment of the test mark which is particularly suitable to be imaged in the scribe line of a substrate. This mark is elongated instead of square-shaped and has a larger dimension in the X direction than in the Y direction, or conversely. The substrate test mark is, for example 220 $\mu$m long and 80 $\mu$m wide, so that this image satisfactorily fits in a scribe line. At a projection with 5× reduction, the mask test mark is five times as large.

A two-dimensional test mark may also be implemented in such a way that it fits in a scribe line.

The invention has been described hereinbefore with reference to its use in an optical projection apparatus. However, it may also be used in an optical lithographic apparatus in which the image of a mask pattern on a substrate is not obtained by projection but by contact copying or proximity imaging. In that case, no projection lens is used, but the mask is placed on or very close to the substrate and this mask is illuminated by a wide beam which is, in principle, parallel. To be able to use the invention, such an apparatus must be provided with an optical alignment device as described hereinbefore. Also in a lithographic apparatus in which no electromagnetic radiation but charged-particle radiation, electron, ion or X-ray radiation is used for imaging a mask pattern, the invention may be used if an optical alignment device as described above is added to such an apparatus. The image can be realized by contact copying, proximity printing or by projection. In the latter case, an adapted projection system such as an electron lens system must of course be used. In all these uses, a mask alignment mark is used as a reference alignment mark. It is alternatively possible to use the invention in lithographic apparatuses which are adapted to directly inscribe the desired patterns in the substrate, and in which no masks are used. In these types of apparatuses, mainly charged-particle radiation is used. When the invention is used, the test mark is also directly written into the substrate and an optical alignment device as described above is added to detect the substrate test mark. The reference alignment mark is then incorporated in the alignment device.

The invention has been described with reference to its use in an apparatus for repetitively imaging and/or scanning a mask pattern on a substrate for manufacturing integrated circuits. Such an apparatus may alternatively be used for manufacturing integrated optical systems or planar optical systems, guidance and detection patterns for magnetic domain memories or a structure of liquid crystal display panels. Though the invention is primarily intended for these apparatuses, it is not limited thereto. It may generally be used in apparatuses in which given patterns must be formed by using accurately defined radiation doses.

What is claimed is:

1. A method of determining the production radiation dose in an apparatus for producing a pattern on a substrate provided in a substrate table, which method comprises the following steps:

providing a substrate having a radiation-sensitive layer in the substrate table;

providing at least one substrate test mark in the radiation-sensitive layer by means of the production radiation;

detecting a substrate test mark by means of an optical alignment device for aligning a substrate alignment mark with respect to a reference alignment mark;

the substrate test mark having a periodical structure, with a period which is effectively equal to that of the reference alignment mark, and an asymmetrical division of irradiated and non-irradiated strips, the test mark detection consisting of:

first, aligning the substrate test mark relative to the reference alignment mark; and subsequently detecting a substrate test mark asymmetry interpreted by the alignment device as a substrate testmark offset, which asymmetry is dependent on the production radiation dose, characterized in that, per period, a substrate test mark has at least two irradiated strips which are formed by means of the same number of different production radiation sub-doses.

2. A method as claimed in claim 1, characterized in that a substrate test mark is provided by directly inscribing said mark into the radiation-sensitive layer by means of narrow-beam charged-particle radiation.

3. A method as claimed in claim 1, characterized in that a substrate test mark is provided by imaging a mask in which at least one mask test mark and one mask alignment mark are present, the mask alignment mark constituting the reference alignment mark and the mask test mark consisting of a periodical structure of intermediate strips which are alternately transmissive and non-transmissive to the production radiation and have a period which is equal to that of the mask alignment mark, the strips having a width of at most one fourth of the period, and in that imaging is realized by forming n sub-images of the mask test mark, while the mask and the substrate are moved relative to each other in between the successive sub-images in a direction perpendicular to the direction of the strips and along a distance which is at least equal to the width of the irradiated strips in the radiation-sensitive layer, the n sub-images being formed with n different radiation sub-doses and n being an integer of at least two.

4. A method as claimed in claim 3, characterized in that, for imaging the mask test mark, the mask is placed proximate to the substrate and the mask is irradiated with production radiation.

5. A method as claimed in claim 3, characterized in that, for imaging the mask test mark, use is made of a projection system which is arranged between the mask and the substrate.

6. A method as claimed in claim 3, characterized in that n is equal to two and that between the formation of the sub-images the mask and the substrate are moved with respect to each other along a distance which is equal to one fourth of the period of the substrate test mark.

7. A method as claimed in claim 1, characterized in that the same test mark is provided m times at different positions on the substrate, while m different radiation doses each having n radiation sub-doses are used for forming the m test marks, and in that the correct radiation dose is determined by comparing the asymmetry in the m substrate test marks.

8. A method as claimed in claim 7, characterized in that the ratio between the received radiation sub-doses is constant for the m substrate test marks.

9. A method as claimed in claim 7, characterized in that one of the radiation sub-doses for the m substrate test marks varies, whereas the other radiation sub-doses are constant.

10. A method as claimed in claim 1, characterized in that, after the provision of the test mark in the radiation-sensitive layer, the latent image formed in said layer is detected by means of the alignment device.

11. A method as claimed in claim 1, characterized in that, after the provision of the test mark in the radiation-sensitive layer, the substrate is removed from the substrate table, subsequently developed and then placed on a substrate table again, whereafter the developed substrate test mark is detected by means of the alignment device.

12. A method as claimed in claim 1, characterized in that the radiation-sensitive layer is provided with a double mark consisting of said test mark and an associated alignment mark having a periodical structure of irradiated strips alternating with non-irradiated strips of the same width and a period which is equal to that of the test mark.

13. A method as claimed in claim 3, characterized in that use is made of a production mask which is provided with at least one test mark.

14. A method as claimed in claim 3, characterized in that use is made of a test mask which is provided with at least one test mark.

* * * * *